US011449323B2

(12) United States Patent
Brock

(10) Patent No.: US 11,449,323 B2
(45) Date of Patent: Sep. 20, 2022

(54) AUTOMATED IDENTIFICATION OF GENERIC MODULE LOCATION PER ELECTRICAL SIGNATURES

(71) Applicant: Ford Global Technologies, LLC, Dearborn, MI (US)

(72) Inventor: Nelson Brock, Palo Alto, CA (US)

(73) Assignee: Ford Global Technologies, LLC, Dearborn, MI (US)

(*) Notice: Subject to any disclaimer, the term of this patent is extended or adjusted under 35 U.S.C. 154(b) by 589 days.

(21) Appl. No.: 16/160,684

(22) Filed: Oct. 15, 2018

(65) Prior Publication Data

US 2020/0117437 A1 Apr. 16, 2020

(51) Int. Cl.
| | |
|---|---|
| *G06F 8/61* | (2018.01) |
| *G05B 19/042* | (2006.01) |
| *G01R 27/16* | (2006.01) |
| *B60W 50/04* | (2006.01) |
| *G01R 31/00* | (2006.01) |
| *G01R 31/60* | (2020.01) |
| *B60W 50/00* | (2006.01) |

(52) U.S. Cl.
CPC ............ *G06F 8/64* (2013.01); *B60W 50/045* (2013.01); *G01R 27/16* (2013.01); *G01R 31/007* (2013.01); *G01R 31/60* (2020.01); *G05B 19/0421* (2013.01); *B60W 2050/0006* (2013.01); *G05B 2219/2212* (2013.01)

(58) Field of Classification Search
USPC ........................................................ 717/176
See application file for complete search history.

(56) References Cited

U.S. PATENT DOCUMENTS

| | | | |
|---|---|---|---|
| 6,501,368 B1 | 12/2002 | Wiebe | |
| 6,795,754 B2 | 9/2004 | Sunami | |
| 7,155,324 B2 | 12/2006 | Blazic | |
| 7,225,420 B2* | 5/2007 | Cress | G01R 31/31813 716/136 |
| 8,890,567 B1* | 11/2014 | Lewis | H03K 19/17764 326/41 |
| 9,524,156 B2 | 12/2016 | Pandya | |
| 9,778,314 B2* | 10/2017 | Suto | G01R 31/2812 |
| 2015/0241498 A1* | 8/2015 | Watanabe | G01R 31/60 324/66 |

FOREIGN PATENT DOCUMENTS

| | | |
|---|---|---|
| EP | 3125111 A1 | 2/2017 |
| WO | WO-2017108409 A1 | 6/2017 |

* cited by examiner

*Primary Examiner* — Ryan D. Coyer
(74) *Attorney, Agent, or Firm* — David R. Stevens; Stevens Law Group

(57) ABSTRACT

A database stored electrical signatures of mounting points for generic modules within a vehicle model. Software for programming each mounting point is mapped to the mounting points. For a production unit of the vehicle model, generic modules are placed at the mounting points without being programmed to perform a specific function. The generic modules measure the electrical signature of the mounting point at which they are mounted. The generic modules then coordinate with a server to identify a matching electrical signature in the database and programming the generic modules with corresponding software for performing specific functions.

19 Claims, 4 Drawing Sheets

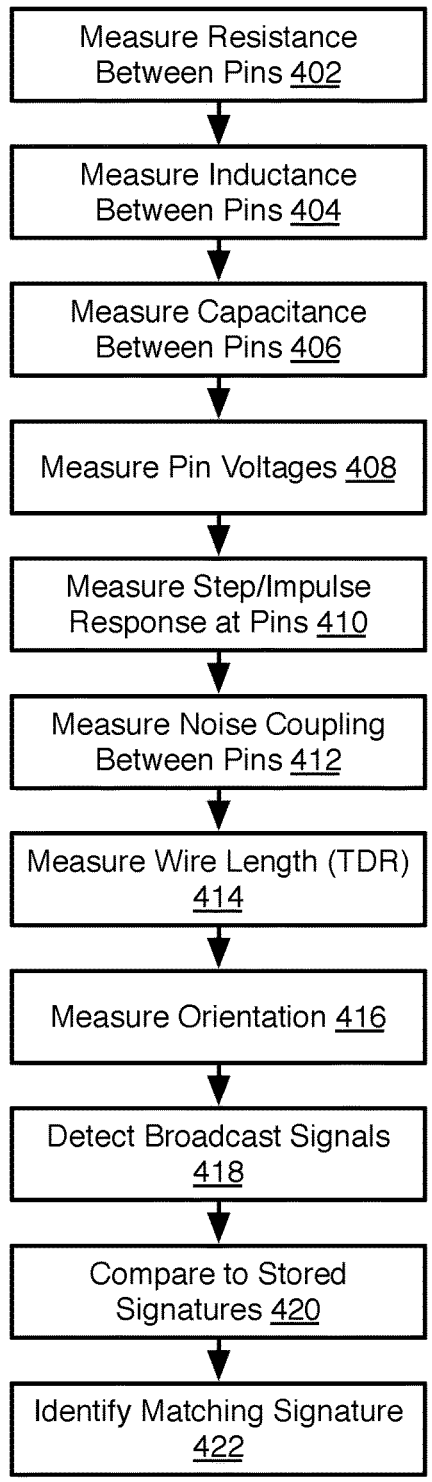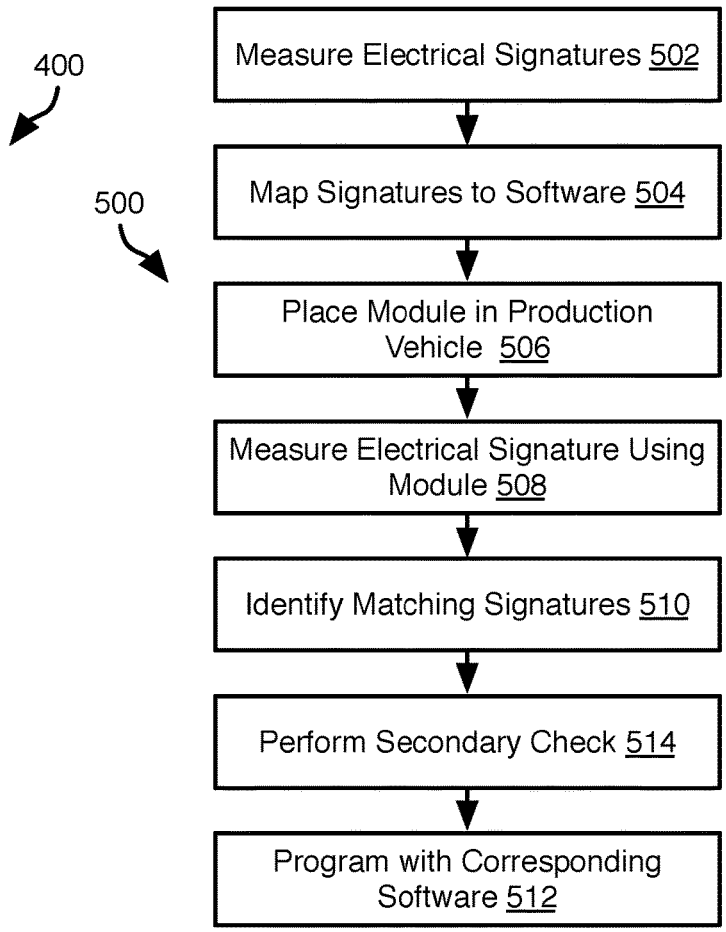
Fig. 4
Fig. 5

US 11,449,323 B2

AUTOMATED IDENTIFICATION OF GENERIC MODULE LOCATION PER ELECTRICAL SIGNATURES

BACKGROUND

Field of the Invention

This invention relates to installing control modules in a system such as vehicle.

Background of the Invention

Electronic modules that use generic (multipurpose) hardware need to be programmed with specialized software to perform their functions. In vehicle assembly, generic hardware modules with unique software need to be differentiated from each other to prevent incorrect installation.

It would be an advancement in the art to facilitate the installation and programming of generic hardware modules in a system such as a vehicle.

BRIEF DESCRIPTION OF THE DRAWINGS

In order that the advantages of the invention will be readily understood, a more particular description of the invention briefly described above will be rendered by reference to specific embodiments illustrated in the appended drawings. Understanding that these drawings depict only typical embodiments of the invention and are not therefore to be considered limiting of its scope, the invention will be described and explained with additional specificity and detail through use of the accompanying drawings, in which:

FIG. 4 is a process flow diagram of a method for programming a generic module according to an electrical signature in accordance with an embodiment of the present invention; and FIG. 5 is a process flow diagram of a method for measuring an electrical signature in accordance with an embodiment of the present invention.

DETAILED DESCRIPTION

Figure 1:
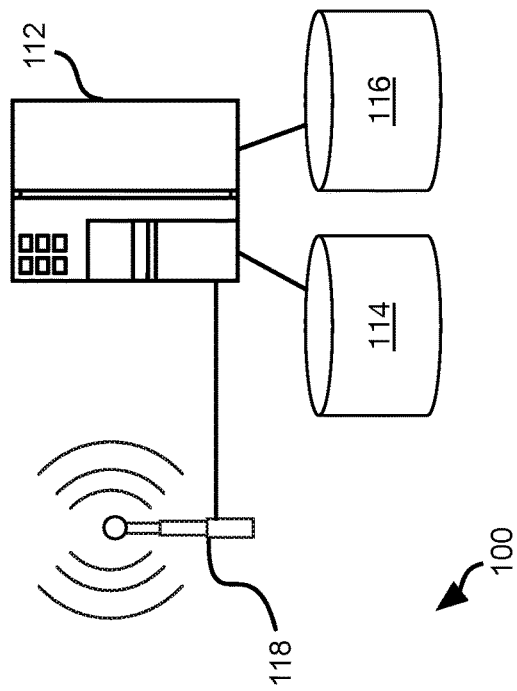
FIG. 1 is a schematic block diagram of an environment in which to implement systems and methods in accordance with an embodiment of the present invention.
Figure 1:
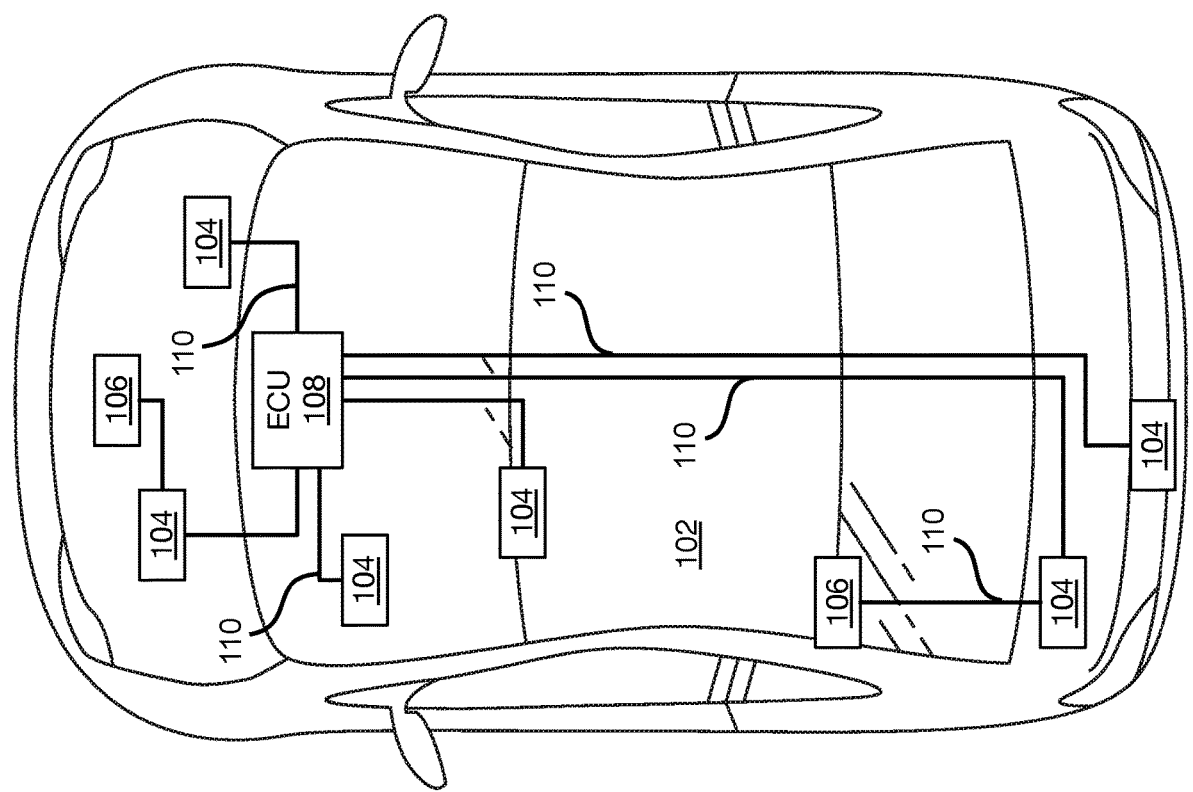

Referring to FIG. 1, an environment 100 in which methods described herein may be implemented may include a vehicle 102. In particular, a vehicle 102 may be a vehicle in the process of being manufactured.

The vehicle 102 includes a plurality of generic modules 104 coupled to one or more components 106, such as switches, sensors, motors, actuators, lights, or other vehicle components. Some of the generic modules 104 may be coupled to an electronic control unit (ECU) 108 or other computing device of the vehicle 102, such as an in-vehicle infotainment (IVI) system. Generic modules 104 may also be coupled to one another.

The coupling between generic module 104 and any other entity 104, 106, 108 may be by means of wiring harnesses 110. The wiring harnesses 110 may be wiring harnesses as known in the art of vehicle manufacture. In particular, a wiring harness 110 may include bundles of wires. Wires of a wiring harness 110 may be bundled together along part of their length and branch from one another at one or more points on the bundle.

The generic modules 104 may interact with a server system 112 hosting or accessing a database 114 of electrical signatures. As discussed in greater detail below, each electrical signature measures inherent electrical properties of wires connecting to a particular generic module 104 and loads coupled to the particular generic module 104 by those wires. Each generic module is at a particular physical location within the vehicle 102 and at a particular mounting point of the wiring harnesses 110. The inherent electrical properties of the wires connected to the mounting point constitute a signature of the mounting point and may include properties of the wires as well as loads (e.g. other entities 104, 106, 108) connected to the wires connected to the mounting point. Each mounting point may have a mounting point identifier such that each electrical signature stored in the database 114 is mapped to a unique mounting point identifier.

Each generic module 104 therefore measures a first electrical signature of its mounting point and cooperates with the server to match the first electrical signature with a second electrical signature stored in the database 114. The mounting point identifier mapped to the second electrical signature may also be mapped to software implementing the function corresponding to the mounting point. For example, software implementing various functions of a vehicle may be stored in a database 116 hosted or accessed by the server system 112 or by a separate software server.

Examples of functions that may be performed by the generic module may include any that may be implemented by systems of a vehicle 102. Some non-limiting examples may include: a power folding seat module, power liftgate module, upfitter's module, ancillary body module, heated steering wheel module, ancillary translator module, climate control seat module, retractable tow bar module, open sesame liftgate module, switch interface module, charge port light module, MY20+ hazard backlight flasher, and MY20+ front trunk release module.

The server system 112 may communicate with the generic modules 104 wirelessly by means of a wireless antenna 118 or may connected directly, such as by way of the ECU 108 or some other component.

Figure 2:
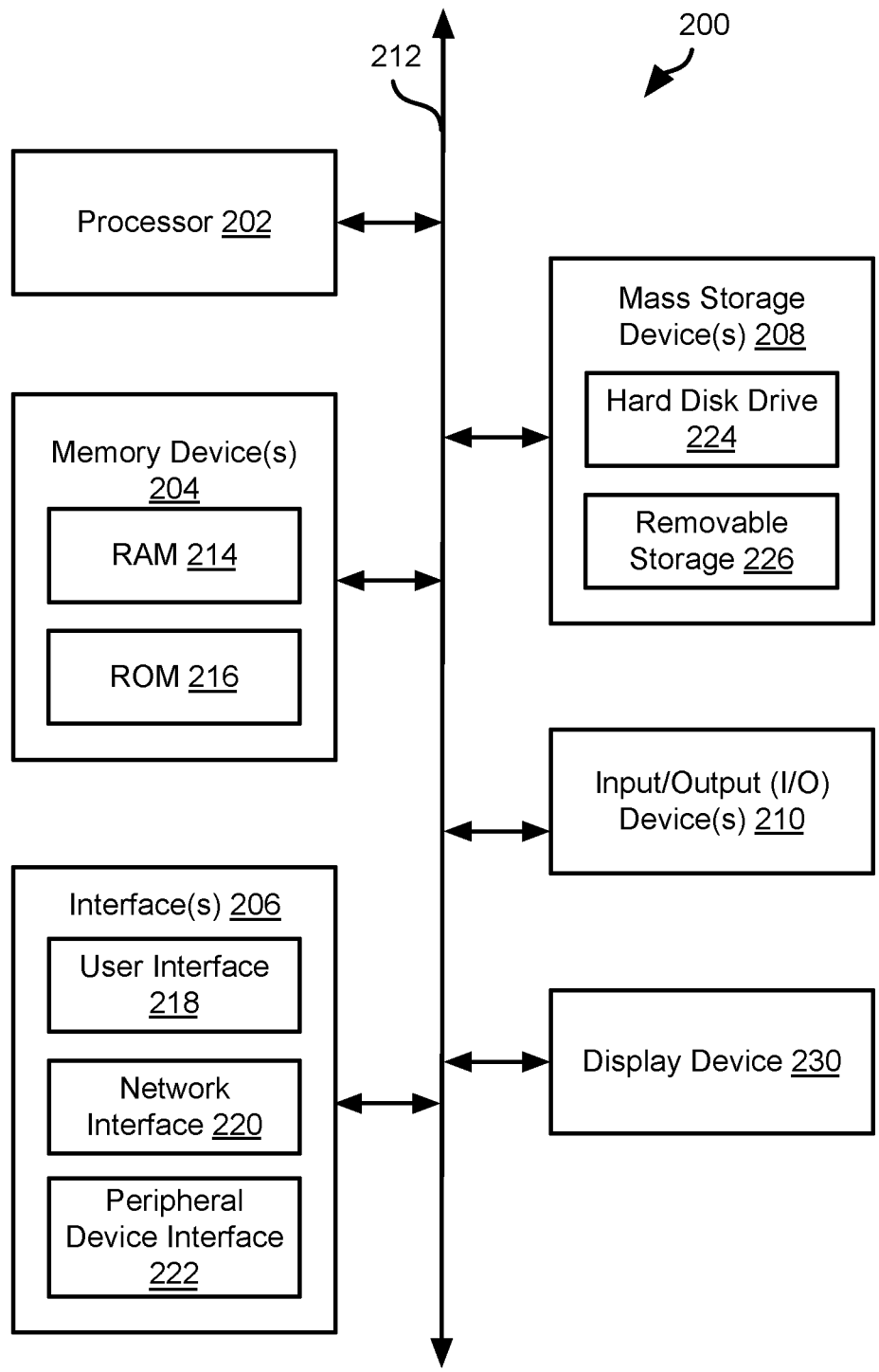
FIG. 2 is a schematic block diagram of an example computing device suitable for implementing methods in accordance with embodiments of the present invention.

FIG. 2 is a block diagram illustrating an example computing device 200. Computing device 200 may be used to perform various procedures, such as those discussed herein. The server system 112, ECU 108, and generic modules 104 may have some or all of the attributes of the computing device 200.

Computing device 200 includes one or more processor(s) 202, one or more memory device(s) 204, one or more interface(s) 206, one or more mass storage device(s) 208, one or more Input/Output (I/O) device(s) 210, and a display device 230 all of which are coupled to a bus 212. Processor(s) 202 include one or more processors or controllers that execute instructions stored in memory device(s) 204 and/or mass storage device(s) 208. Processor(s) 202 may also include various types of computer-readable media, such as cache memory.

Memory device(s) 204 include various computer-readable media, such as volatile memory (e.g., random access memory (RAM) 214) and/or nonvolatile memory (e.g., read-only memory (ROM) 216). Memory device(s) 204 may also include rewritable ROM, such as Flash memory.

Mass storage device(s) 208 include various computer readable media, such as magnetic tapes, magnetic disks, optical disks, solid-state memory (e.g., Flash memory), and so forth. As shown in FIG. 2, a particular mass storage device is a hard disk drive 224. Various drives may also be included in mass storage device(s) 208 to enable reading from and/or writing to the various computer readable media. Mass storage device(s) 208 include removable media 226 and/or non-removable media.

I/O device(s) 210 include various devices that allow data and/or other information to be input to or retrieved from computing device 200. Example I/O device(s) 210 include cursor control devices, keyboards, keypads, microphones, monitors or other display devices, speakers, printers, network interface cards, modems, lenses, CCDs or other image capture devices, and the like.

Display device 230 includes any type of device capable of displaying information to one or more users of computing device 200. Examples of display device 230 include a monitor, display terminal, video projection device, and the like.

Interface(s) 206 include various interfaces that allow computing device 200 to interact with other systems, devices, or computing environments. Example interface(s) 206 include any number of different network interfaces 220, such as interfaces to local area networks (LANs), wide area networks (WANs), wireless networks, and the Internet. Other interface(s) include user interface 218 and peripheral device interface 222. The interface(s) 206 may also include one or more peripheral interfaces such as interfaces for printers, pointing devices (mice, track pad, etc.), keyboards, and the like.

Bus 212 allows processor(s) 202, memory device(s) 204, interface(s) 206, mass storage device(s) 208, I/O device(s) 210, and display device 230 to communicate with one another, as well as other devices or components coupled to bus 212. Bus 212 represents one or more of several types of bus structures, such as a system bus, PCI bus, IEEE 1394 bus, USB bus, and so forth.

For purposes of illustration, programs and other executable program components are shown herein as discrete blocks, although it is understood that such programs and components may reside at various times in different storage components of computing device 200, and are executed by processor(s) 202. Alternatively, the systems and procedures described herein can be implemented in hardware, or a combination of hardware, software, and/or firmware. For example, one or more application specific integrated circuits (ASICs) can be programmed to carry out one or more of the systems and procedures described herein.

Figure 3:
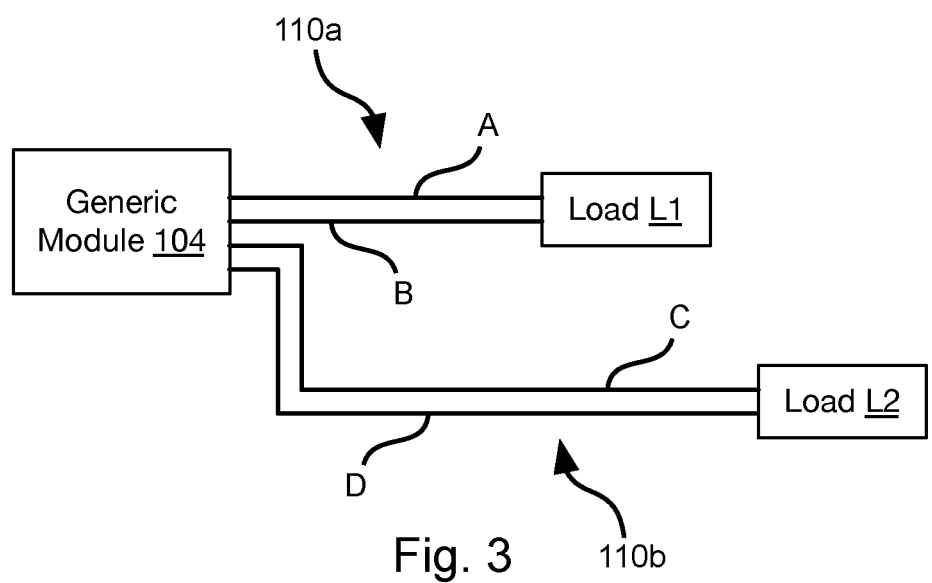
FIG. 3 is schematic block diagram illustrating a generic module for measuring the electrical signatures of wires coupled thereto in accordance with an embodiment of the present invention.

Referring to FIG. 3, a generic module 104 may be mounted to wires A-D that are bundled in one or more bundles 110a, 110b of wires of the wiring harnesses 110 of the vehicle 102. As shown, a pair of wires (A, B and C, D) may couple the generic module 104 to a load L1, L2. Each load L1, L2 may be embodied as another entity 104, 106, or 108. Each wire A-D may be coupled to a pin on a load L1, L2 such that any path of the entity 104, 106, 108 coupling a pair of wires (A, B), (C, D) to one another constitutes the load L1, L2 for that pair of wires. Note that "load" is used very generically and may include a power source, resistive load, reactive load, a one directional load that permits signals to pass in only one direction (e.g., comparable to a diode). A load may be a "high impedance load," i.e. there is no electric path between the wires of a pair (A, B), (C, D) for such loads.

In addition to the load, each wire of a pair (A, B), (C, D) may have an individual length and may have a portion of that length in which the wires of the pair are bundled together and therefore have mutual inductance and/or capacitance.

A generic module 104 may include a plurality of pins each connected to a plurality of wires. Accordingly, a set of wire pairings may be defined as each possible pairing of any two pins of the plurality of pins, e.g., (A, B), (A, C), (A, D), (B, C), (B, D), and (C, D) in the illustrated example. Accordingly, the electrical properties for some or all of these pairings may be evaluated. The combination of the electrical properties for all of the pairings measured may constitute the electrical signature measured by the generic module 104.

Referring to FIG. 4, measuring of the electrical signature of a generic module 104 in place at a mounting point within the vehicle 102 may include some or all of the illustrated steps. The generic module 104 may be loaded with software programming the generic module 104 to perform some or all of the steps of the method 400 and will include circuitry for performing the measurements associated with the steps of the method 400 that are executed. The measurements described below may be performed while the vehicle is running, e.g. at idle.

The method 400 may include, for each pairing of pins of the generic module, measuring 402, 404, 406 the resistance, capacitance, and/or inductance between the pins of the pairing. The manner in which these values are measured may be according to any method known in the art. In some embodiments, unique resistances, capacitances, or inductances may be added coupling wires connected by a load L1, L2 to facilitate unique identification. In other instances, only inherent parasitic resistance, capacitance, and inductance of wires and loads are used without deliberate placement of reactive or resistive elements with unique values.

The method 400 may further include measuring 408 the voltage between pins of each pairing or between an individual pin and a pin known to be at a ground potential or other reference voltage.

The method 400 may include measuring 410 a step response or impulse response between pins of a pairing, i.e. inputting a step/impulse on one pin and measuring a returned signal on a second pin of the pairing.

The method 400 may include measuring 412 noise coupling between pins of a pairing, e.g. by inputting a coded signal on one pin and measuring amplitude of the coded signal on the second pin of the pairing.

The method 400 may include measuring 414 a length of the wire connected to a pin of the generic module 104, such as by using time domain reflectometery (TDR) or some other measurement approach.

In some embodiments, the generic module 104 may include an accelerometer such that the orientation of the module 104 may be measured 416 from the output of the output of the accelerometer.

In some embodiments, the generic module 104 may include a wireless receiver or transceiver. The method 400 may include detecting 418 broadcast signals. For example, a device in the vehicle, such as the ECU 108 or an IVI system may broadcast a wireless signal, such as according to the BLUETOOTH protocol. Step 418 may include detecting such signals and calculating an estimated distance according to strength of the signals. Multiple beacons may broadcast signals thereby enabling the generic module 104 to estimate distances to each of the beacons.

Note that in some embodiments, none of the loads measured according to those of steps 402-418 that are performed provide a code that is unique to the mounting point and could be used to identify the mounting point to which the generic module 104 is mounted.

The measurements from those of steps 402-418 that are performed may then be compared 420 to signatures in the database 114. In particular, for a particular vehicle model, the electrical signature at each mounting point according to some or all of steps 402-418 may be measured and mapped to that mounting point. E.g. a signature Si may be mapped to an identifier Mi for a particular mounting point at which that signature Si was measured. For each mounting point Mi, corresponding software Wi may be mapped to that mounting point Mi. The corresponding software Wi is software that programs a generic module 104 at that mounting point Mi to perform the specialized function associated with that mounting point Mi, such as any of the functions listed above with respect to FIG. 1.

Accordingly, step 420 may include evaluating the electrical signature according to steps 402-418 with respect to the signatures stored in the database 114 and identifying a stored signature that matches. Whether a signature matches may include determining whether values measured at a particular step 402-418 is within a predetermined tolerance of the value corresponding to that step in a stored signature. For example, resistance measured between pins of the generic module 104 with identifiers P1 and P2 may be determined to match if within X percent of the resistance recorded in the stored signature for the same pin identifiers P1 and P2. In a like manner, for each measurement of steps 402-418 for a pin with a pin identifier or pair of pins with a pair of pin identifiers, measurements in a stored signature for the same pin identifier or pair of pin identifiers may be compared to determine whether they match within a predetermined tolerance for that measurement 402-418.

If all of the measurements of steps 402-418 match corresponding measurements of a stored signature within the specified tolerance for the measurements, then the generic module may be determined 422 to match that stored signature.

FIG. 5 illustrates a method by which a generic module is associated with a mounting point and programmed with software corresponding to that mounting point. The method 500 may be executed by the server system 102 in cooperation with the generic module 104. The method 500 may be executed for each generic module 104 to be programmed. Note that where there are N generic modules, the method 500 may be performed N−1 times inasmuch as once all but one generic module 104 are mapped to mounting points, the last generic module 104 may be assumed to be at the mounting point that has not been previously mapped to another generic module 104.

The method 500 may include populating the database 114 with stored signatures for a particular vehicle model. This may include performing steps 502 and 504 for each mounting point of the vehicle model ("the subject mounting point"). In particular, the method 500 may include measuring 502 the electrical signature 104 of the subject mounting point using a generic module 104 or other testing devices. Step 502 may include performing some or all of the measurements of steps 402-418 at the subject mounting point corresponding to a mounting point identifier of the subject mounting point and storing the results as a signature in the database 114 mapped to that mounting point identifier. The stored results may be stored in raw form or processed into a different form that is stored. As noted above, the measurements of step 502 may be performed while the unit of the vehicle model is running, e.g. at idle.

The method 500 may further include mapping 504 the signature of step 502 to software implementing the function associated with the subject mounting point. A mapping between the subject mounting point and its corresponding software may be provided by a human operator. Accordingly, the signature from step 502 may be mapped 504 to an identifier of the subject mounting point or an identifier of the corresponding software or its storage location.

For each vehicle ("the production vehicle") of the vehicle model that was the subject of steps 502 and 504, steps 506-512 may be executed for each generic module 104 placed in the production vehicle ("the subject module"). As noted above, once N−1 of N generic modules 104 are mapped according to steps 506-512, the Nth generic module 104 may be mapped to the mounting point that is not mapped to any of the other generic modules 104.

The method 500 may include placing 506 the subject module at a mounting point ("the subject mounting point") in the production vehicle. This may include inserting the subject module in a socket at the subject mounting point such that pins of the generic module are in electrical contact with wires of one or more wiring harnesses 110.

The method 500 may thein include measuring 508 the electrical signature of the subject mounting point and identifying 510 a matching stored signature in the database 114, such as a signature recorded at steps 502-504. Steps 508 and 510 may be performed as described above with respect to some or all of steps 402-418 and step 422. The measurements of step 508 may be performed while the production vehicle is running, e.g. at idle.

The method 500 may then include programming 512 the subject module with the software mapped to the stored signature identified at step 510. For example, the subject module may have a flash memory that may be programmed with an executable image of the software mapped to the mounting point identifier corresponding to the matching stored signature. The corresponding software may be identified as being mapped to the same mounting point identifier as the matching signature in the database 114.

In some embodiments, a secondary check may be performed 514 following identification 510 of a matching signature and either before or after programming 512 with software. For example, the mounting point identifier corresponding to the matching signature may correspond to the mounting point for a control module of a particular component 106. Accordingly, step 514 may include transmitting signals to that component 106 and evaluating a response (e.g., returned data, inductance, capacitance, impulse response, back EMF, voltage, etc.).

For example, if the component is a motor and the mounting point identifier is determined to be the mounting point for a control module for a liftgate motor, a signal to drive the motor would result in detection of the inductance of the coils of the motor. Likewise, the current drawn by the motor could change over time in a predictable manner, e.g. a drive motor for opening a liftgate would have a time varying current as the angle of the liftgate changes and as the liftgate reaches the end of its travel. Accordingly, by measuring this current over time, the generic module 104 may confirm that the motor coupled to it corresponds to the motor for the liftgate and the identification of the mounting point of the generic module was correct. Step 514 may be performed by the generic module 104 in cooperation with the server 112. For example, measurements may be performed by the generic module 104 as instructed by the server. The generic module 104 then returns to the measurements to the server, which compares the measurements to stored measurements corresponding to the mounting point identifier to determine if they are sufficiently similar, e.g. similar within a threshold tolerance.

In some embodiments where step 514 is performed, step 512 is performed only after the secondary check of step 514 is satisfied.

In the foregoing description reference is made to vehicles. However, the above-described approach to using generic modules may be implemented in any system that includes wiring harnesses, such as an aircraft, automated machinery, or the like.

Note also that measurements at step 502 may be replaced in some instances by computed values obtained based on a model of the wiring harnesses and loads of the design of the vehicle 102.

As is apparent form the above disclosure, a generic module 104 may be placed at a mounting point in a vehicle 102 without being programmed with any function, other than that required to measure the electrical signature of the mounting point. The generic module 104 therefore does not need to be marked or stored separately from generic modules to be placed at different mounting points. This reduces costs for maintaining inventory and reduces opportunities for incorrect placement.

In the above disclosure, reference has been made to the accompanying drawings, which form a part hereof, and in which is shown by way of illustration specific implementations in which the disclosure may be practiced. It is understood that other implementations may be utilized and structural changes may be made without departing from the scope of the present disclosure. References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

Implementations of the systems, devices, and methods disclosed herein may comprise or utilize a special purpose or general-purpose computer including computer hardware, such as, for example, one or more processors and system memory, as discussed herein. Implementations within the scope of the present disclosure may also include physical and other computer-readable media for carrying or storing computer-executable instructions and/or data structures. Such computer-readable media can be any available media that can be accessed by a general purpose or special purpose computer system. Computer-readable media that store computer-executable instructions are computer storage media (devices). Computer-readable media that carry computer-executable instructions are transmission media. Thus, by way of example, and not limitation, implementations of the disclosure can comprise at least two distinctly different kinds of computer-readable media: computer storage media (devices) and transmission media.

Computer storage media (devices) includes RAM, ROM, EEPROM, CD-ROM, solid state drives ("SSDs") (e.g., based on RAM), Flash memory, phase-change memory ("PCM"), other types of memory, other optical disk storage, magnetic disk storage or other magnetic storage devices, or any other medium which can be used to store desired program code means in the form of computer-executable instructions or data structures and which can be accessed by a general purpose or special purpose computer.

An implementation of the devices, systems, and methods disclosed herein may communicate over a computer network. A "network" is defined as one or more data links that enable the transport of electronic data between computer systems and/or modules and/or other electronic devices. When information is transferred or provided over a network or another communications connection (either hardwired, wireless, or a combination of hardwired or wireless) to a computer, the computer properly views the connection as a transmission medium. Transmissions media can include a network and/or data links, which can be used to carry desired program code means in the form of computer-executable instructions or data structures and which can be accessed by a general purpose or special purpose computer. Combinations of the above should also be included within the scope of computer-readable media.

Computer-executable instructions comprise, for example, instructions and data which, when executed at a processor, cause a general purpose computer, special purpose computer, or special purpose processing device to perform a certain function or group of functions. The computer executable instructions may be, for example, binaries, intermediate format instructions such as assembly language, or even source code. Although the subject matter has been described in language specific to structural features and/or methodological acts, it is to be understood that the subject matter defined in the appended claims is not necessarily limited to the described features or acts described above. Rather, the described features and acts are disclosed as example forms of implementing the claims.

Those skilled in the art will appreciate that the disclosure may be practiced in network computing environments with many types of computer system configurations, including, an in-dash vehicle computer, personal computers, desktop computers, laptop computers, message processors, hand-held devices, multi-processor systems, microprocessor-based or programmable consumer electronics, network PCs, minicomputers, mainframe computers, mobile telephones, PDAs, tablets, pagers, routers, switches, various storage devices, and the like. The disclosure may also be practiced in distributed system environments where local and remote computer systems, which are linked (either by hardwired data links, wireless data links, or by a combination of hardwired and wireless data links) through a network, both perform tasks. In a distributed system environment, program modules may be located in both local and remote memory storage devices.

Further, where appropriate, functions described herein can be performed in one or more of: hardware, software, firmware, digital components, or analog components. For example, one or more application specific integrated circuits (ASICs) can be programmed to carry out one or more of the systems and procedures described herein. Certain terms are used throughout the description and claims to refer to particular system components. As one skilled in the art will appreciate, components may be referred to by different names. This document does not intend to distinguish between components that differ in name, but not function.

It should be noted that the sensor embodiments discussed above may comprise computer hardware, software, firmware, or any combination thereof to perform at least a portion of their functions. For example, a sensor may include computer code configured to be executed in one or more processors, and may include hardware logic/electrical circuitry controlled by the computer code. These example devices are provided herein purposes of illustration, and are not intended to be limiting. Embodiments of the present disclosure may be implemented in further types of devices, as would be known to persons skilled in the relevant art(s). At least some embodiments of the disclosure have been directed to computer program products comprising such logic (e.g., in the form of software) stored on any computer useable medium. Such software, when executed in one or more data processing devices, causes a device to operate as described herein.

Computer program code for carrying out operations of the present invention may be written in any combination of one or more programming languages, including an object-oriented programming language such as Java, Smalltalk, C++, or the like and conventional procedural programming languages, such as the "C" programming language or similar programming languages. The program code may execute entirely on a computer system as a stand-alone software package, on a stand-alone hardware unit, partly on a remote computer spaced some distance from the computer, or entirely on a remote computer or server. In the latter scenario, the remote computer may be connected to the computer through any type of network, including a local area network (LAN) or a wide area network (WAN), or the connection may be made to an external computer (for example, through the Internet using an Internet Service Provider).

The present invention is described above with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions or code. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a non-transitory computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

While various embodiments of the present disclosure have been described above, it should be understood that they have been presented by way of example only, and not limitation. It will be apparent to persons skilled in the relevant art that various changes in form and detail can be made therein without departing from the spirit and scope of the disclosure. Thus, the breadth and scope of the present disclosure should not be limited by any of the above-described exemplary embodiments, but should be defined only in accordance with the following claims and their equivalents. The foregoing description has been presented for the purposes of illustration and description. It is not intended to be exhaustive or to limit the disclosure to the precise form disclosed. Many modifications and variations are possible in light of the above teaching. Further, it should be noted that any or all of the aforementioned alternate implementations may be used in any combination desired to form additional hybrid implementations of the disclosure.

What is claimed is:

1. A method comprising:
   measuring first electrical signatures of first module mount points in a first wire layout in a first system;
   mapping the first electrical signatures to locations of the first module mount points;
   determining a location of each generic module of one or more generic modules at one or more second module mount points in a second wire layout in a second system having a design of the first system according to the mapping and one or more second electrical signatures of the one or more second module mount points; and
   programming, by a computer system, each generic module of the one or more generic modules with software mapped to the location of each generic module in a database.

2. The method of claim 1, wherein the first system if a first vehicle of a vehicle model and the second system is a second vehicle of the vehicle model.

3. The method of claim 2, wherein the first wire layout is a first plurality of wiring harnesses according to the vehicle model; and
   the second wire layout is a second plurality of wiring harnesses according to the vehicle model.

4. The method of claim 3, wherein:
   wherein each first mount point of the first module mount points includes a plurality of first pins coupled to wires of the first plurality of harnesses;
   wherein measuring the first electrical signatures of the first module mount points comprises, for each module mount point of the first module mount points, measuring at least one of a reactance and a resistance between first pins of the each module mount point.

5. The method of claim 3, wherein:
   the first system further includes one or more first components coup led to the first plurality of wiring harnesses according to the vehicle model;
   the second system further includes one or more second components coupled to the second plurality of wiring harnesses according to the vehicle model; and
   wherein measuring the first electrical signatures of the first module mount points comprises, for each module mount point of the first module mount points, measuring at least one of a reactance, a resistance, and a voltage between first pins of the each module mount point resulting from a component of the one or more first components.

6. The method of claim 3, wherein:
wherein each first mount point of the first module mount points includes a plurality of first pins coupled to wires of the first plurality of wiring harnesses; and
wherein measuring the first electrical signatures of the first module mount points comprises, for each module mount point of the first module mount points, measuring noise coupling between pairs of pins of the plurality of first pins of the each module mount point.

7. The method of claim 3, wherein:
wherein each first mount point of the first module mount points includes a plurality of first pins coupled to wires of the first plurality of wiring harnesses; and
wherein measuring the first electrical signatures of the first module mount points comprises, for each module mount point of the first module mount points, measuring at least one of an impulse response and a step response between first pins of the each module mount point.

8. The method of claim 3, wherein:
wherein each first mount point of the first module mount points includes a plurality of first pins coupled to wires of the first plurality of wiring harnesses; and
wherein measuring the first electrical signatures of the first module mount points comprises, for each module mount point of the first module mount points, measuring a length of a wire of the wires of the first plurality of wiring harnesses connected to each pin of the plurality of first pins of each module mount point using time domain reflectometry.

9. The method of claim 3, wherein measuring the first electrical signatures of the first module mount points comprises, for each module mount point of the first module mount points, measuring an orientation of a generic module mounted to the each module mount point.

10. A system comprising:
a database storing a plurality of first electrical signatures for a plurality of module mount points in a plurality of wiring harnesses of a vehicle model;
a computer system coupled to the database;
a vehicle according to the vehicle model and including a plurality of generic modules mounted at the plurality of module mount points in the plurality of wiring harnesses of the vehicle;
wherein each generic module of the plurality of generic modules is identically programmed to:
measure a second electrical signature of a module mount point of the plurality of module mount points to which the each generic module is coupled;
cooperate with the computer system to identify a first electrical signature of the plurality of first electrical signatures matching the second electrical signature; and
cooperate with the computer system to program the each generic module with software corresponding to the first electrical signature of the plurality of first electrical signatures matching the second electrical signature.

11. The system of claim 10, wherein each generic module is programmed to measure the second electrical signature of the module mount point of the plurality of module mount points to which the each generic module is coupled by measuring inherent physical properties of first wires of the plurality of wiring harnesses of the vehicle that are coupled to the module mount point of the plurality of module mount points to which the each generic module is coupled.

12. The system of claim 11, wherein each generic module is programmed to measure the inherent physical properties of the first wires by measuring at least one of a reactance and a resistance between pairs of wires of the first wires.

13. The system of claim 11, wherein each generic module is programmed to measure the second electrical signature of the module mount point of the plurality of module mount points to which the each generic module is coupled without receiving an identification code from any computing device in the vehicle.

14. The system of claim 11, wherein:
the vehicle further includes one or more components coupled to the plurality of wiring harnesses of the vehicle; and
wherein each generic module is programmed to measure the inherent physical properties of the first wires by measuring loading on the first wires due to at least one of the one or more components.

15. The system of claim 11, wherein each generic module is programmed to measure the inherent physical properties of the first wires by measuring noise coupling between pairs of wires of the first wires.

16. The system of claim 11, wherein each generic module is programmed to measure the inherent physical properties of the first wires by measuring at least one of an impulse response and a step response between pairs of wires of the first wires.

17. The system of claim 11, wherein each generic module is programmed to measure the inherent physical properties of the first wires by measuring lengths of the first wires using time domain reflectometry.

18. The system of claim 11, wherein each generic module is programmed to measure an orientation of the each generic module and include the orientation in the second electrical signature of the each generic module.

19. The system of claim 11, wherein each generic module is programmed to measure a relative location to at least one beacon in the vehicle and include the relative location in the second electrical signature.

* * * * *